United States Patent
Jang et al.

(10) Patent No.: US 8,035,456 B1
(45) Date of Patent: Oct. 11, 2011

(54) MULTI-PHASE SIGNAL GENERATOR AND VOLTAGE-CONTROLLED OSCILLATOR THEREOF

(75) Inventors: Sheng-Lyang Jang, Taipei (TW); Cheng-Chen Liu, Taipei County (TW); Yi-Jhe Song, Changhua County (TW)

(73) Assignee: National Taiwan University of Science and Technology, Taipei (TW)

( * ) Notice: Subject to any disclaimer, the term of this patent is extended or adjusted under 35 U.S.C. 154(b) by 47 days.

(21) Appl. No.: 12/753,071

(22) Filed: Apr. 1, 2010

(51) Int. Cl.
*H03B 5/12* (2006.01)
*H03C 3/22* (2006.01)
(52) U.S. Cl. .............. 331/117 FE; 331/46; 331/177 V
(58) Field of Classification Search ............... 331/45, 331/46, 56, 117 FE, 117 R, 167, 177 V
See application file for complete search history.

(56) References Cited

U.S. PATENT DOCUMENTS

| 7,522,007 | B2* | 4/2009 | Jang et al. | 331/172 |
| 7,545,230 | B2* | 6/2009 | Jang et al. | 331/177 V |
| 7,659,784 | B2* | 2/2010 | Jang et al. | 331/40 |
| 7,782,101 | B2* | 8/2010 | Jang et al. | 327/118 |

OTHER PUBLICATIONS

Jang et al., A Differential Clapp-VCO in 0.13 μm CMOS Technology, IEEE Microwave and Wireless Components Letters, vol. 19, No. 6, Jun. 2009, p. 404-p. 406.
Hajimiri et al., Design Issues in CMOS Differential LC Oscillators, IEEE Journal of Solid-State Circuits, vol. 34, No. 5, May 1999, p. 717-p. 724.
Lee et al., Low-Phase Noise Hartley Differential CMOS Voltage Controlled Oscillator, IEEE Microwave and Wireless Components Letters, vol. 17, No. 2, Feb. 2007, p. 145-p. 147.
Aparicio et al., A Noise-Shifting Differential Colpitts VCO, IEEE Journal of Solid-State Circuits, vol. 37, No. 12, Dec. 2002, p. 1728-p. 1736.

* cited by examiner

*Primary Examiner* — Levi Gannon
(74) *Attorney, Agent, or Firm* — Jianq Chyun IP Office

(57) ABSTRACT

A VCO comprising a cross-coupled transistors module and a resonant module is provided. The resonant module comprises a first transistor, second transistor, a first inductor and varactor string and a second inductor and varactor string. The first source/drain terminal of the first transistor coupled to the second reference voltage, the second source/drain terminal of the first transistor coupled to the cross-coupled transistors module and the gate terminal coupled to a bias voltage. The first source/drain terminal of the second transistor coupled to the second reference voltage, the second source/drain terminal of the second transistor coupled to the cross-coupled transistors module and the gate terminal of the second transistor coupled to the bias voltage. The first and second inductor and varactor strings coupled between the gate of the first and second transistors and a tuning voltage in serial, separately.

14 Claims, 2 Drawing Sheets

MULTI-PHASE SIGNAL GENERATOR AND VOLTAGE-CONTROLLED OSCILLATOR THEREOF

BACKGROUND OF THE INVENTION

1. Field of Invention

The present invention relates to a multi-phase signals generator and a voltage-controlled oscillator thereof.

2. Description of Related Art

In today's technology, voltage-controlled oscillators (VCOs) can be divided into three types, such as Colpittis oscillator, Hartely oscillator and Cross-couple oscillator. Most of the VCOs archive basic oscillation function by a resonant circuit composed of inductors and capacitors. The VCOs always be used in a phase lock loop (PLL) circuit, and in the presupposition of green power design, a power consumption of the PLL circuit is the most important point for designer. That is, it is the most important topic to archive a voltage-controlled oscillator with low power consumption in the design of the PLL circuit.

In the other way, with the progress of communication industry, integrated circuits (IC) have been widely applied in wireless communication. Such as that, a multi-phase signal generator (such as a quadrature-phase signal generator) comprising voltage-controlled oscillators be used. That is, the VCOs play an important role in modern communication systems. As the frequency up- and down-conversion is mainly performed by the mixers at the front electrode of the VCOs and the transmitter/receiver, the noise of the VCOs will influence the noise level of the entire transceiver. Therefore, it is an important subject how to reduce the phase noise of the VCOs.

SUMMARY OF THE INVENTION

Accordingly, the present invention is directed to providing a voltage-controlled oscillator capable of operating under large tunable frequency range.

The present invention is also directed to providing a multi-phase signal generator capable of operating under large tunable frequency range.

A VCO comprising a cross-coupled transistors module and a resonant module is provided. The cross-coupled transistors module coupled to a first reference voltage and the resonant module coupled to the cross-coupled transistors module and a second reference voltage. The resonant module comprises a first transistor, second transistor, a first inductor and varactor string and a second inductor and varactor string. The first transistor having a first source/drain terminal, a second source/drain terminal and a gate terminal and the first source/drain terminal coupled to the second reference voltage, the second source/drain terminal coupled to the cross-coupled transistors module and the gate terminal coupled to a bias voltage. The second transistor having a first source/drain terminal, a second source/drain terminal and a gate terminal and the first source/drain terminal of the second transistor coupled to the second reference voltage, the second source/drain terminal of the second transistor coupled to the cross-coupled transistors module and the gate terminal coupled to the bias voltage. The first inductor and varactor string coupled between the gate of the first transistor and a tuning voltage in serial. The second inductor and varactor string coupled between the gate of the second transistor and the tuning voltage in serial.

According to the design concept of the VCO of the present invention, the first inductor and varactor string comprises a first inductor and a first varactor. The first inductor having a first terminal and a second terminal and the first terminal coupled to the gate of the first transistor. The first varactor having a first terminal and a second terminal and the first terminal of the first varactor coupled to a second terminal of the first inductor and the second terminal of the first varactor coupled to the tuning voltage.

According to the design concept of the VCO of the present invention, the second inductor and varactor string comprises a second inductor and a second varactor. The second inductor having a first terminal and a second terminal and the first terminal coupled to the gate of the second transistor. The second varactor having a first terminal and a second terminal and the first terminal of the second varactor coupled to a second terminal of the second inductor and the second terminal of the second varactor coupled to the tuning voltage.

According to the design concept of the VCO of the present invention, the resonant module further comprises a first capacitor and a second capacitor. The first capacitor coupled between the gate terminal and second source/drain terminal of the first transistor, and the second capacitor coupled between the gate terminal and second source/drain terminal of the second transistor.

According to the design concept of the VCO of the present invention, the resonant module further comprises a first resistor and a second resistor. The first resistor coupled between the coupled path of the bias voltage and the gate terminal of the first transistor, and the second resistor coupled between the coupled path of the bias voltage and the gate terminal of the second transistor.

According to the design concept of the VCO of the present invention, the cross-coupled transistors module comprises a first cross-coupled transistor and a second cross-coupled transistor. The first cross-coupled transistor having a first source/drain terminal, a second source/drain terminal and a gate terminal, the first source/drain tem final coupled to the resonant module and the gate terminal of the second cross-coupled transistor, the second source/drain terminal coupled to the first reference voltage, and the gate terminal of the first cross-coupled transistor coupled to the first source/drain terminal of the second cross-coupled transistor. The second cross-coupled transistor having a first source/drain terminal, a second source/drain terminal and a gate terminal, the first source/drain terminal of the second cross-coupled transistor coupled to the resonant module and the gate terminal of the first cross-coupled transistor, the second source/drain terminal of the second cross-coupled transistor coupled to the first reference voltage, and the gate terminal of the second cross-coupled transistor coupled to the first source/drain terminal of the first cross-coupled transistor.

According to the design concept of the VCO of the present invention, the VCO further comprises a first output buffer and a second output buffer. The first output buffer having an input terminal coupled to the second source/drain terminal of the first transistor and an output terminal for generating a first output signal. The second output buffer having an input terminal coupled to the second source/drain terminal of the second transistor and an output terminal for generating a second output signal.

A multi-phase signal generator multi-phase signal generator comprising two voltage-controlled oscillators is also provided. Each of the voltage-controlled oscillators coupled to each other. Each of the voltage-controlled oscillators comprises a cross-coupled transistors module and a resonant module. The cross-coupled transistors module coupled to a first reference voltage and the resonant module coupled to the cross-coupled transistors module and a second reference voltage. The resonant module comprises a first transistor, a second transistor, a first inductor and varactor string and a second inductor and varactor string. The first transistor having a first source/drain terminal, a second source/drain terminal and a gate terminal, wherein the first source/drain terminal coupled to the second reference voltage, the second source/drain terminal coupled to the cross-coupled transistors module and the gate terminal coupled to a bias voltage. The second transistor having a first source/drain terminal, a second source/drain terminal and a gate terminal, the first source/drain terminal final coupled to the second reference voltage, wherein the second source/drain terminal coupled to the cross-coupled transistors module and the gate terminal coupled to the bias voltage. The first inductor and varactor string coupled between the gate of the first transistor and a tuning voltage in serial and the second inductor and varactor string coupled between the gate of the second transistor and the tuning voltage in serial.

In order to the make aforementioned and other objects, features and advantages of the present invention comprehensible, preferred embodiments accompanied with figures are described in detail below.

It is to be understood that both the foregoing general description and the following detailed description are exemplary, and are intelectrodeed to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
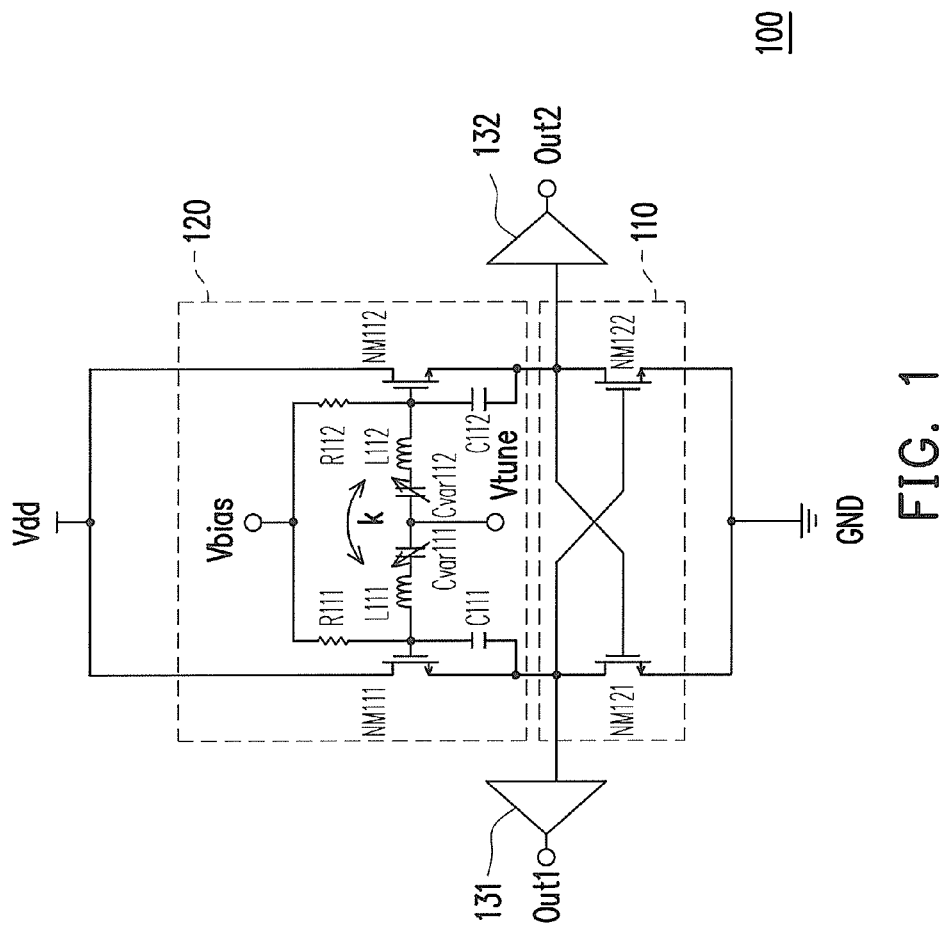
FIG. 1 is a circuit of a VCO 100 according to a preferred embodiment of the present invention.

FIG. 1 is a circuit of a VCO 100 according to a preferred embodiment of the present invention. The VCO includes cross-coupled transistors module 110 and resonant module 120. The cross-coupled transistors module 110 coupled to reference voltage GND and the resonant module 120 coupled to the cross-coupled transistors module 110 and reference voltage Vdd. Please notice here, the resonant module 120 includes transistor NM111, NM112, inductor L111, L112 and varactor Cvar111, Cvar112. The inductor L111 and the varactor Cvar111 coupled between the gate terminal of transistor NM111 and tuning voltage Vtune in serial to from a first inductor and varactor string. The inductor L112 and the varactor Cvar112 coupled between the gate terminal of transistor NM112 and the tuning voltage Vtune in serial to from a second inductor and varactor string. Further, the first source/drain terminal of the transistor NM111 is coupled to the reference voltage Vdd and the second source/drain terminal of the transistor NM111 is coupled to the cross-coupled transistors module 110. Symmetrical to the transistor NM111, the first source/drain terminal of the transistor NM112 is coupled to the reference voltage Vdd and the second source/drain terminal of the transistor NM112 is also coupled to the cross-coupled transistors module 110.

Please note that, the resonant frequency of the resonant module 120 is varied by the varactor Cvar111 and Cvar112. In this embodiment, the resonant module 120 forms by the first inductor and varactor string, the second inductor and varactor string, transistors NM111, NM112 and capacitors C111 and C112 to be a series-tunable resonant module. There is no current flows through the inductor L111 and L112, the power consumption of the VCO 100 not be increased. The inductors L111 and L112 are designed to be a transformer for enhancing quality factor of the resonant module 120, further, increasing the phase noise of the output signal of the VCO 100 and reducing the circuit area of the VCO 100.

The varactors Cvar 111 and Cvar112 are designed to be operated in an accumulation mode for increasing the ability for tuning the resonant frequency of the resonant module 120. Please notice here, the resonant frequency of the resonant module 120 can be presented as formula (I) shown as below:

$$f = \frac{1}{2\pi}\left[\frac{1}{L111}\left(\frac{1}{Cact} + \frac{1}{C\,\mathrm{var}111}\right)\right]^{1/2} \quad (1)$$

Wherein f is the resonant frequency of the resonant module 120, Cact is effective capacitance of the parasitical capacitance of transistor NM111 and capacitor C111. In formula (1), capacitance Cvar111 is smaller than capacitance Cact. That is, the capacitance of the varactor Cvar111 dominates the resonant frequency f of the resonant module 120, the tuning range of the resonant frequency increasing correspondingly.

Besides, in this embodiment, the inductances of the inductors L111 and L112 are the same, and the capacitances of the varactor Cvar111 and Cvar112 are the same. Further, the coupled coefficient between the indictor L111 and L112 is k.

By the way, the varactors Cvar 111 and Cvar112 operated in the accumulation mode also have better quality factor, such as that, the phase noise of the output of VCO 100 will be better.

The gate terminals of transistors NM111 and NM112 are coupled to bias voltage Vbias. Resistors R111 and R112 are coupled between coupled path of the bias voltage Vbias and the gate terminal of transistors NM111 and NM112 separately. The resistors R111 and R112 are used for electrostatic discharge (ESD) protection and are not essentially for resonant module 120.

The cross-coupled transistors module 110 includes cross-coupled transistors NM121 and NM122. The cross-coupled transistor NM121 having a first source/drain terminal, a second source/drain terminal and a gate terminal. The first source/drain terminal of the cross-coupled transistor NM121 coupled to the resonant module and the gate terminal of the cross-coupled transistor NM122, and the second source/drain terminal of the cross-coupled transistor NM121 coupled to the reference voltage GND. The gate terminal of the cross-coupled transistor NM121 coupled to the first source/drain terminal of the cross-coupled transistor NM122. The cross-coupled transistor NM122 having a first source/drain terminal, a second source/drain terminal and a gate terminal. The first source/drain terminal of the cross-coupled transistor NM122 coupled to the resonant module and the gate terminal of the cross-coupled transistor NM121, and the second source/drain terminal of the cross-coupled transistor NM122 coupled to the reference voltage GND. The gate terminal of the cross-coupled transistor NM122 coupled to the first source/drain terminal of the cross-coupled transistor NM121.

In this embodiment, the VCO 100 further includes output buffers 131 and 132. The output buffer 131 having an input terminal coupled to the second source/drain terminal of the transistor NM111 and an output terminal for generating an output signal Out1. The output buffer 132 having an input terminal coupled to the second source/drain terminal of the transistor NM112 and an output terminal for generating an output signal Out2.

Figure 2:
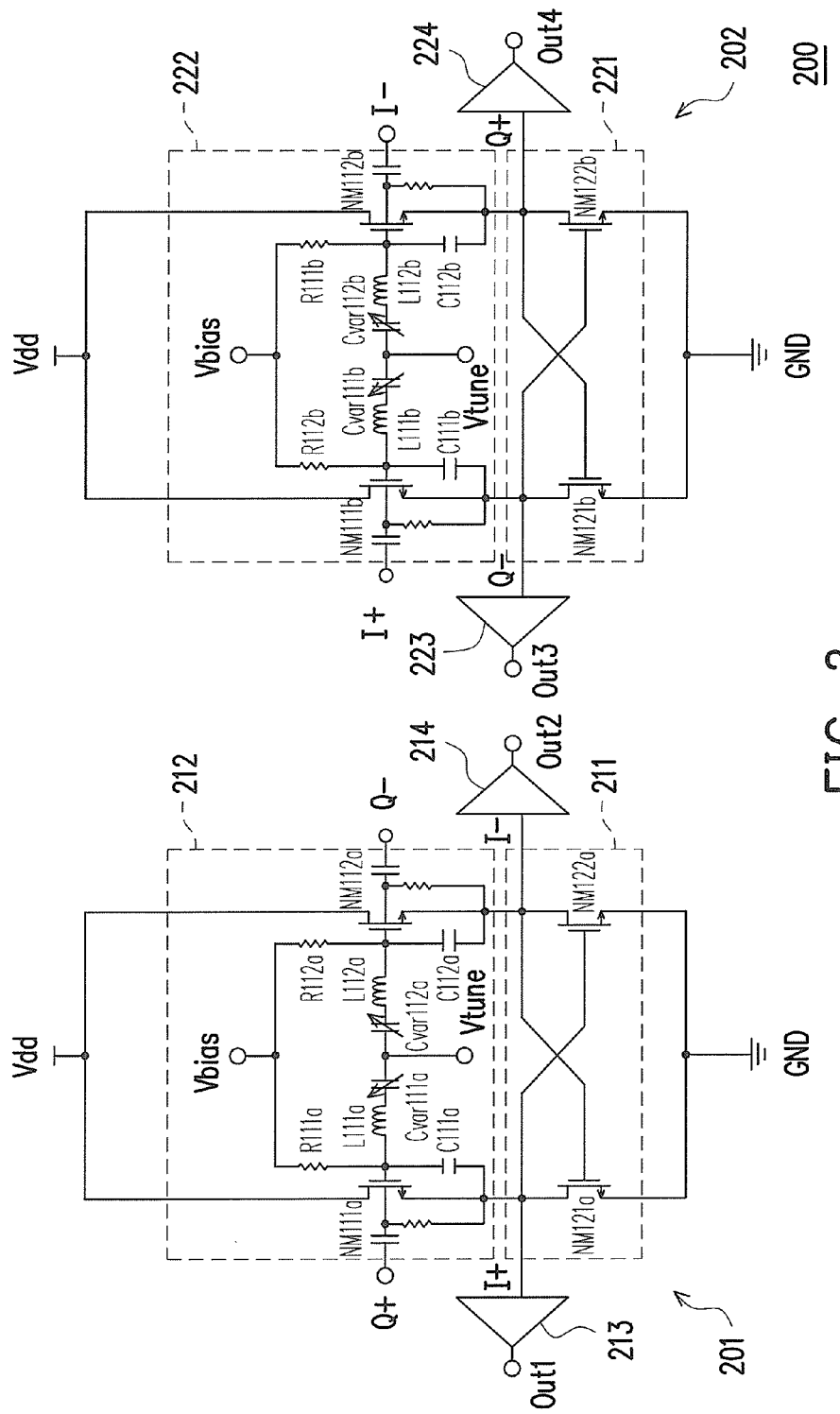
FIG. 2 is a circuit of a multi-signal generator 200 according to a preferred embodiment of the present invention.

FIG. 2 is a circuit of a multi-signal generator 200 according to a preferred embodiment of the present invention. The multi-signal generator 200 includes two VCOs 201 and 202. The VCO 201 includes cross-coupled transistors module 211 and resonant module 212. The resonant module 212 includes transistors NM111a, NM112a, inductors L111a, L112a, varactors Cvar111a, Cvar112a, capacitors C111a, C112a and resistors R111a and R112a. The varactors Cvar111a and the inductors L111a are coupled in serial between the tuning voltage Vtune and the gate terminal of the transistor NM111a to form one inductor and varactor string. The varactors Cvar112a and the inductors L112a are coupled in serial between the tuning voltage Vtune and the gate terminal of the transistor NM112a to form the other inductor and varactor string.

The cross-coupled transistors module 211 includes cross-coupled transistors NM121a and NM122a. The cross-coupled transistors NM121a and NM122a are connected to each other in cross-coupled configuration.

Please notice here, the circuit structure if the VCO 201 is similar to the VCO 100 of previously presented embodiment. The circuit operation of VCO 100 in FIG. 1 and VCO 201 in this embodiment are the same, and there is no unnecessary detail given.

The VCO 202 includes cross-coupled transistors module 221 and resonant module 222. The resonant module 222 includes transistors NM111b, NM112b, inductors L111b, L112b, varactors Cvar111b, Cvar112b, capacitors C111b, C112b and resistors R111b and R112b. The varactors Cvar111b and the inductors L111b are coupled in serial between the tuning voltage Vtune and the gate terminal of the transistor NM111b to form one inductor and varactor string. The varactors Cvar112b and the inductors L112b are coupled in serial between the tuning voltage Vtune and the gate terminal of the transistor NM112b to form the other inductor and varactor string.

The cross-coupled transistors module 221 includes cross-coupled transistors NM121b and NM122b. The cross-coupled transistors NM121b and NM122b are connected to each other in cross-coupled configuration.

Output buffers 213 and 214 are coupled to the first drain/source of the transistors NM121a and NM122a respectively. The output buffers 213 and 214 receive signals I+ and I− on the first drain/source of the transistors NM121a and NM122a and generate output signals Out1 and Out2 separately. Similarly, output buffers 223 and 224 are coupled to the transistors NM121b and NM122b respectively. The output buffers 223 and 224 receive signals Q+ and Q− on the first drain/source of the transistors NM121b and NM122b and generate output signals Out3 and Out4 separately. The VCO 201 and the VCO 202 generate four different phase output signals I+, I−, Q+ and Q− separately. Furthermore, the circuit structures of the VCO 201 and the VCO 202 are the same. The signals I+ and I− on the VCO 201 are coupled to the bulks of the transistors NM111b and NM112b respectively, and the signals Q+ and Q− on the VCO 202 are coupled to the bulks of the transistors NM111a and NM112a respectively.

To sum up, the present invention adopts a new design concept, in which the inductor and varactor are connected in serial in the resonant module. Such as that the capacitance of the varactor will dominates the resonant frequency of the resonant module and the larger tunable frequency range be obtained. Furthermore, there is no current flow through the inductor in the inductor and varactor string and the power consumption will not increase.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage-controlled oscillator (VCO), comprising:
a cross-coupled transistors module, coupled to a first reference voltage; and
a resonant module, coupled to the cross-coupled transistors module and a second reference voltage, the resonant module comprising:
a first transistor, having a first source/drain terminal, a second source/drain terminal and a gate terminal, the first source/drain terminal coupled to the second reference voltage, the second source/drain terminal coupled to the cross-coupled transistors module and the gate terminal coupled to a bias voltage;
a second transistor, having a first source/drain terminal, a second source/drain terminal and a gate terminal, the first source/drain terminal coupled to the second reference voltage, the second source/drain terminal coupled to the cross-coupled transistors module and the gate terminal coupled to the bias voltage;
a first inductor and varactor string, coupled between the gate of the first transistor and a tuning voltage in serial; and
a second inductor and varactor string, coupled between the gate of the second transistor and the tuning voltage in serial.

2. The VCO as claimed in claim 1, wherein the first inductor and varactor string comprising:
a first inductor, having a first terminal and a second terminal, the first terminal coupled to the gate of the first transistor; and
a first varactor, having a first terminal and a second terminal, the first terminal of the first varactor coupled to the second terminal of the first inductor and the second terminal of the first varactor coupled to the tuning voltage.

3. The VCO as claimed in claim 1, wherein the second inductor and varactor string comprising:
a second inductor, having a first terminal and a second terminal, the first terminal coupled to the gate of the second transistor; and
a second varactor, having a first terminal and a second terminal, the first terminal of the second varactor coupled to the second terminal of the second inductor and the second terminal of the second varactor coupled to the tuning voltage.

4. The VCO as claimed in claim 1, wherein the resonant module further comprising:
a first capacitor, coupled between the gate terminal and second source/drain terminal of the first transistor; and
a second capacitor, coupled between the gate terminal and second source/drain terminal of the second transistor.

5. The VCO as claimed in claim 1, wherein the resonant module further comprising:
a first resistor, coupled between the coupled path of the bias voltage and the gate terminal of the first transistor; and
a second resistor, coupled between the coupled path of the bias voltage and the gate terminal of the second transistor.

6. The VCO as claimed in claim 1, wherein the cross-coupled transistors module comprising:
a first cross-coupled transistor, having a first source/drain terminal, a second source/drain terminal and a gate terminal, the first source/drain terminal coupled to the resonant module and the gate terminal of the second cross-coupled transistor, the second source/drain terminal coupled to the first reference voltage, and the gate terminal of the first cross-coupled transistor coupled to the second source/drain terminal of the first cross-coupled transistor; and
a second cross-coupled transistor, having a first source/drain terminal, a second source/drain terminal and a gate terminal, the first source/drain terminal coupled to the resonant module and the gate terminal of the first cross-coupled transistor, the second source/drain terminal of the second cross-coupled transistor coupled to the first reference voltage, and the gate terminal of the second cross-coupled transistor coupled to the first source/drain terminal of the first cross-coupled transistor.

7. The VCO as claimed in claim 1 further comprising:
a first output buffer, having an input terminal coupled to the second source/drain terminal of the first transistor and an output terminal for generating a first output signal; and
a second output buffer, having an input terminal coupled to the second source/drain terminal of the second transistor and an output terminal for generating a second output signal.

8. A multi-phase signal generator, comprising:
two voltage-controlled oscillators, each of the voltage-controlled oscillators coupled to each other and each of the voltage-controlled oscillators comprising:
a cross-coupled transistors module, coupled to a first reference voltage; and
a resonant module, coupled to the cross-coupled transistors module and a second reference voltage, the resonant module comprising:
a first transistor, having a first source/drain terminal, a second source/drain terminal and a gate terminal, the first source/drain terminal coupled to the second reference voltage, the second source/drain terminal coupled to the cross-coupled transistors module and the gate terminal coupled to a bias voltage;
a second transistor, having a first source/drain terminal, a second source/drain terminal and a gate terminal, the first source/drain terminal coupled to the second reference voltage, the second source/drain terminal coupled to the cross-coupled transistors module and the gate terminal coupled to the bias voltage;
a first inductor and varactor string, coupled between the gate of the first transistor and a tuning voltage in serial; and
a second inductor and varactor string, coupled between the gate of the second transistor and the tuning voltage in serial.

9. The multi-phase signal generator as claimed in claim 8, wherein the first inductor and varactor string comprising:
a first inductor, having a first terminal and a second terminal, the first terminal coupled to the gate of the first transistor; and
a first varactor, having a first terminal and a second terminal, the first terminal of the first varactor coupled to the second terminal of the first inductor and the second terminal of the first varactor coupled to the tuning voltage.

10. The multi-phase signal generator as claimed in claim 8, wherein the second inductor and varactor string comprising:
a second inductor, having a first terminal and a second terminal, the first terminal coupled to the gate of the second transistor; and
a second varactor, having a first terminal and a second terminal, the first terminal of the second varactor coupled to the second terminal of the second inductor and the second terminal of the second varactor coupled to the tuning voltage.

11. The multi-phase signal generator as claimed in claim 8, wherein the resonant module further comprising:
a first capacitor, coupled between the gate terminal and second source/drain terminal of the first transistor; and
a second capacitor, coupled between the gate terminal and second source/drain terminal of the second transistor.

12. The multi-phase signal generator as claimed in claim 8, wherein the resonant module further comprising:
a first resistor, coupled between the coupled path of the bias voltage and the gate terminal of the first transistor; and
a second resistor, coupled between the coupled path of the bias voltage and the gate terminal of the second transistor.

13. The multi-phase signal generator as claimed in claim 8, wherein the cross-coupled transistors module comprising:
a first cross-coupled transistor, having a first source/drain terminal, a second source/drain terminal and a gate terminal, the first source/drain terminal coupled to the resonant module and the gate terminal of the second cross-coupled transistor, the second source/drain terminal coupled to the first reference voltage, and the gate terminal of the first cross-coupled transistor coupled to the second source/drain terminal of the first cross-coupled transistor; and
a second cross-coupled transistor, having a first source/drain terminal, a second source/drain terminal and a gate terminal, the first source/drain terminal coupled to the resonant module and the gate terminal of the first cross-coupled transistor, the second source/drain terminal of the second cross-coupled transistor coupled to the first reference voltage, and the gate terminal of the second cross-coupled transistor coupled to the first source/drain terminal of the first cross-coupled transistor.

14. The multi-phase signal generator as claimed in claim 8, wherein each of the voltage-controlled oscillators further comprising:
a first output buffer, having an input terminal coupled to the second source/drain terminal of the first transistor and an output terminal for generating a first output signal; and
a second output buffer, having an input terminal coupled to the second source/drain terminal of the second transistor and an output terminal for generating a second output signal.

* * * * *